United States Patent [19]

Fukushima

[11] Patent Number: 4,866,004
[45] Date of Patent: Sep. 12, 1989

[54] METHOD OF FORMING GROOVE ISOLATION FILLED WITH DIELECTRIC FOR SEMICONDUCTOR DEVICE

[75] Inventor: Toshitaka Fukushima, Yokohama, Japan

[73] Assignee: Fujitsu Limited, Kawasaki, Japan

[21] Appl. No.: 236,319

[22] Filed: Aug. 25, 1988

Related U.S. Application Data

[63] Continuation of Ser. No. 915,521, Oct. 6, 1986, abandoned.

[30] Foreign Application Priority Data

Oct. 5, 1985 [JP] Japan ................................. 60-222596

[51] Int. Cl.$^4$ ..................... H01L 21/76; H01L 27/00
[52] U.S. Cl. .......................................... 437/67; 437/61; 437/228; 437/235
[58] Field of Search ..................... 437/61, 63, 67, 68, 437/72, 73, 228, 235

[56] References Cited

U.S. PATENT DOCUMENTS

| | | | |
|---|---|---|---|
| 3,783,047 | 1/1974 | Paffen et al. | 156/644 |
| 3,961,999 | 6/1976 | Antipov | 437/73 |
| 3,966,514 | 6/1976 | Feng et al. | 437/67 X |
| 4,002,511 | 1/1977 | Magdo et al. | 148/333 X |
| 4,104,086 | 8/1978 | Bondur et al. | 29/580 |
| 4,271,583 | 6/1981 | Kahng et al. | 437/978 X |
| 4,272,308 | 6/1981 | Varshney | 437/978 X |
| 4,292,156 | 9/1981 | Matsumoto et al. | 437/61 |
| 4,462,846 | 7/1984 | Varshney | 437/978 X |
| 4,509,249 | 4/1985 | Goto et al. | 437/67 |
| 4,528,047 | 7/1985 | Beyer et al. | 437/67 |
| 4,533,429 | 8/1985 | Josquin | 437/65 |
| 4,534,824 | 8/1985 | Chen | 29/576 W |
| 4,538,343 | 9/1985 | Pollack et al. | 29/580 |
| 4,561,172 | 12/1985 | Slawimski et al. | 29/580 |
| 4,563,227 | 1/1986 | Sakai et al. | 29/576 W |
| 4,579,812 | 4/1986 | Bower | 156/648 |
| 4,580,330 | 4/1986 | Pollack et al. | 29/580 |
| 4,635,090 | 1/1987 | Tamaki et al. | 357/55 |
| 4,636,281 | 1/1987 | Buiguez et al. | 148/DIG. 50 |
| 4,689,656 | 8/1987 | Silvestri et al. | 437/62 X |

FOREIGN PATENT DOCUMENTS

| | | | |
|---|---|---|---|
| 0082532 | 5/1983 | Japan | 29/576 W |
| 0084443 | 5/1983 | Japan | 29/576 W |
| 0140137 | 8/1983 | Japan | 29/576 W |
| 0168233 | 10/1983 | Japan | 29/576 W |
| 0197137 | 11/1984 | Japan | 148/DIG. 131 |

OTHER PUBLICATIONS

Bennet, "Selective Planarization Process and Structures", IBM TDB vol. 27, No. 4B, Sep. 1984, pp. 2560-2562.
Benjamin, "Self-Aligned Recessed Oxide Isolation Process/Structure to Minimize 'Birds' Beak" Formation, IBM TDB vol. 22, Dec. 1979, pp. 2449-2450.
Ghandhi, "VLSI Fabrication Principles", John Wiley and Sons, 1983, pp. 488-490.

*Primary Examiner*—Olik Chaudhuri
*Assistant Examiner*—Tim Thomas
*Attorney, Agent, or Firm*—Staas & Halsey

[57] ABSTRACT

In manufacturing processes of an integrated circuit, isolation technology between adjacent active elements on a substrate plays an important role. Groove isolation filled with dielectric is known as an effective way of achieving a high integration density, however the prior art methods of forming the isolation groove have the problem of formation of BIRD'S HEAD or BIRD'S BEAK portions around the isolation region, which restricts the integration density and deteriorates a flatness of the substrate. The method of forming isolation groove according to the present invention discloses that the method comprising the steps of removing a silicon oxide layer on a specified region surrounding the isolation groove, and depositing a silicon nitride layer directly on the substrate and forming the groove self-aligned using the above silicon oxide layer removal process, eliminates the above mentioned problems achieving a higher density of integration, a flatness of the substrate and improvement of the integrated circuit.

6 Claims, 6 Drawing Sheets

METHOD OF FORMING GROOVE ISOLATION FILLED WITH DIELECTRIC FOR SEMICONDUCTOR DEVICE

This is a continuation of co-pending application Ser. No. 915,521 filed on Oct. 6, 1986.

BACKGROUND OF THE INVENTION

1. Field of the Invention

The present invention relates to a method of forming a groove isolation filled with a dielectric material for a semiconductor device, more particularly to a method appicable for an integrated circuit which requires a high integration density, wherein the prior art has a problem the formation of a so-called BIRD'S BEAK or BIRD'S HEAD in forming a groove isolation, which limits the integration density. The method moreover has a special feature of forming isolation grooves by a self-alignment method.

With a need for higher integration density in semiconductor technology, various methods of isolatio have been introduced. A method relating to a pn-junction isolation has been utilized for a long time, but this method needs a comparatively large isolation region on a substrate. In order to increase an integration density, a selective oxidation method of isolation has been introduced, known as LOCOS or Isoplanar isolation and has been widely used.

In another method for obtaining still higher integration density, a groove (sometimes called a trench, depending on its shape) isolation filled with dielectric material has been introduced. The present invention relates to this type of isolation method.

2. Description of the Prior Art

The isolation method of forming a groove and filling it with a dielectric material such as polysilicon is well known. The shape of the groove is divided into a few types, a V shape type, a trench type having a groove of deep depth and narrow width, a combination type of V shape and deep trench, etc. For simplicity, hereinafter, the first type is called a V-groove, the second a U-groove, and the third a Y-groove.

V-groove is formed in a silicon substrate having a surface crystal index of orientation (100) utilizing a method of wet etching in alkali solution, a U-groove is formed utilizing a method of reactive ion etching. U-groove is suitable for forming a depper groove than a V-groove.

The method of forming V-groove isolation filled with dielectric in the prior art is explained briefly using FIGS. 1(a) through 1(f). FIG. 1(a) shows a cross sectional view of a substrate 1, which comprises a p⁻-type silicon base layer 1, an n⁺-type silicon buried layer 2, and an n-type silicon epitaxial layer 3, and is formed by conventional bipolar techniques. The substrate 1 has a surface index of orientation (100). A silicon oxide (SiO₂) layer 4 and a silicon nitride (Si₃N₄) layer 5 are formed on the silicon epitaxial layer 3. Both layers 4 and 5 corresponding to a region 6 of a top area of the V-groove are selectively etched and removed.

When the substrate having the above crystal orientation is used, anisotropical etching is carried out using an alkali solution, such as potassium hydroxide (KOH), and a V-groove is formed, whereby silicon oxide layer 4 and silicon nitride layer 5 are used as etch masks. A V-shape groove 14 is then formed as shown in FIG. 1(b).

When the dimension W in FIG. 1(a) is defined as a width of the V-groove, then the depth D of the V-groove is determined by the following relation:

$$D = (\tfrac{1}{2}) \times W \times \tan(54.7°) \approx 0.7\, W$$

The equation shows that the depth of the groove is smaller than the width W ofthe isolation region.

In FIG. 1(c) a silicon oxide layer 7, having a thickness of about 5,000 Angstroms is grown on an inside surface of the groove by thermal oxidation process, and thereafter polycrystalline silicon (polysilicon) 8 is grown on an entire surface of the substrate 1, the groove being filled 093rewith.

Polysilicon 8 is polished mechanically and chemically using the silicon nitride layer 5 as a stopper as shown in FIG. 1(d).

The surface of the polysilicon 8 filling the V-groove is thermally oxidized forming a silicon oxide layer 9 of 5,000 to 8,000 Angstroms in thickness, as shown in FIG. 1(e).

After the silicon nitride layer 5 is removed, the substrate having a planar surface covered with a silicon oxide layers 4 and 9, and having a V-groove for isolation is formed as shown in FIG. 1(f).

The method described above is used to form V-groove isolation. When a deep isolation forming a vertical narrow trench (U-groove) is needed, an anisotropic etching method of reactive ion etching is utilized, wherein a mixed gas of carbon tetrachloride (CCl₄) and oxygen (O₂) is used. In forming a U-groove, silicon crystal orientation (100) is not necessary as in the case of a V-groove above described. Other processes, except for the above etching process, are the same as those applied for the V-groove.

The method of forming grooves above causes the formation of BIRD'S BEAK or BIRD'S HEAD, which increases the integration density of semiconductor devices.

FIG. 2 is an enlarged cross sectional view of a V-groove just before the removing step of silicon nitride layer 5. Three silicon oxide layers of first formed layer 4, second formed layer 7 inside the V-groove, and third formed layer 9 from polysilicon are joined together at the peripheral region of the V-groove on the substrate.

Thickness of the silicon oxide at the joint projects vertically forming the so-called BIRD'S HEAD 21, and the thickness of the fBIRD'S HEAD decrease in an outward lateral direction under silicon nitride layer 5 forming the so-called BIRD'S BEAK 22. These phenomena are caused by the fact that the oxidation of silicon requires additional amounts of space approximately to the volume of initial silicon and that oxidation of silicon has different characteristics depending on the material such as silicon substrate or polysilicon, and oxidation conditions thereof. The silicon and polysilicon, which forms the peripheral region of the V-groove, is most subjected to the oxidation process. Therefore, the volume of the silicon oxide increases vertically and laterally the shape thereof is deformed irregularly. This is almost the same in the case of forming a U-groove.

As explained above, the method of forming groove isolation filled with dielectric in the prior art has an important drawback of injuring the flatness of the substrate surface and substantially increasing the width of the groove isolation. This results in requiring more tolerance in subsequent mask alignment processes, limiting an integration density and incurring a poor quality of an active element caused by the wiring layer having steep steps on the grooves in a semiconductor device.

SUMMARY OF THE INVENTION

It is a general object of the invention to provide a method of forming a groove isolation filled with dielectric without having a BIRD'S BEAK or BIRD'S HEAD problem.

It is another objective of the invention to provide a method of forming an isolation groove self-aligned with a mask process utilized in avoiding the BIRD's BEAK or BIRD'S HEAD problem.

It is still another objective of the invention to provide a method of forming a substrate having a flat surface around the groove isolation regions and avoiding a factor of poor quality in semiconductor device.

It is still further object of the invention to provide a method of producing a semiconductor device having a higher integration density.

As explained in the prior art, a BIRD'S BEAK or BIRD'S HEAD is formed by excess oxidation of silicon material resulting in vertical and lateral swelling of the volume thereof around the peripheral region of the groove on the substrate. The present invention provides a method of preventing the substrate surface around the peripheral region from excess oxidation.

This is achieved by a method which includes the steps of removing a first silicon oxide layer 4, deposited at an early stage as a protective mask, at least on the above peripheral region and depositing a silicon nitride layer directly on the silicon substrate as a protective mask from oxidation. Therefore the surface region of the substrate, the area in which the BIRD's BEAK or BIRD'S HEAD is formed in the prior art, is covered with a protective mask of silicon nitride layer only, and thus the region is prevented from oxidation, the partial swelling of the substrate is prevented, and the surface flatness is maintained.

Moreover, the forming process of an isolation groove is carried out by a self-aligned process with a window formed by removing the first silicon oxide layer.

The groove isolation has a distinctive feature depending on the shape of groove such as V-shape, U-shape (deep trench), and the combination type of Y-shape. The V-groove has characteristics of a shallow groove, a depth of the groove being automatically controlled, and the forming process being simplified. The U-groove has a deep and narrow groove suitable for high integration density, but has difficulty in fabricating the groove.

A combination type, rather resembling a boldfaced Y character in cross section (briefly referred as Y-groove) is a compromised structure between the above two types. The Y-groove is effective and useful for a high integration density and filling up of the groove is easy. A substrate having crystal orientation (100) is used. The upper portion of the groove having sloped side walls is formed by wet etching anisotropically at first, and a lower portion having deep, narrow and vertical side walls is subsequently formed by reactive ion etching.

Embodiments of the present invention include the method of forming isolation grooves self-aligned thus avoiding the growth of BIRD'S BEAK or BIRD'S HEAD for U-groove and Y-groove by applying the method of removing the silicon oxide layer and covering exposed surfaces of the substrate by a silicon nitride layer on the specified region surrounding the isolation groove.

Other objects and advantages of the present invention will become apparent from the detailed description to follow taken in conjunction with the appended claims.

BRIEF DESCRIPTION OF THE DRAWINGS

Throughout the drawings, the same reference numerals designate and identify the same or similar parts.

DETAILED DESCRIPTION OF THE PREFERRED EMBODIMENTS

Figure 1:
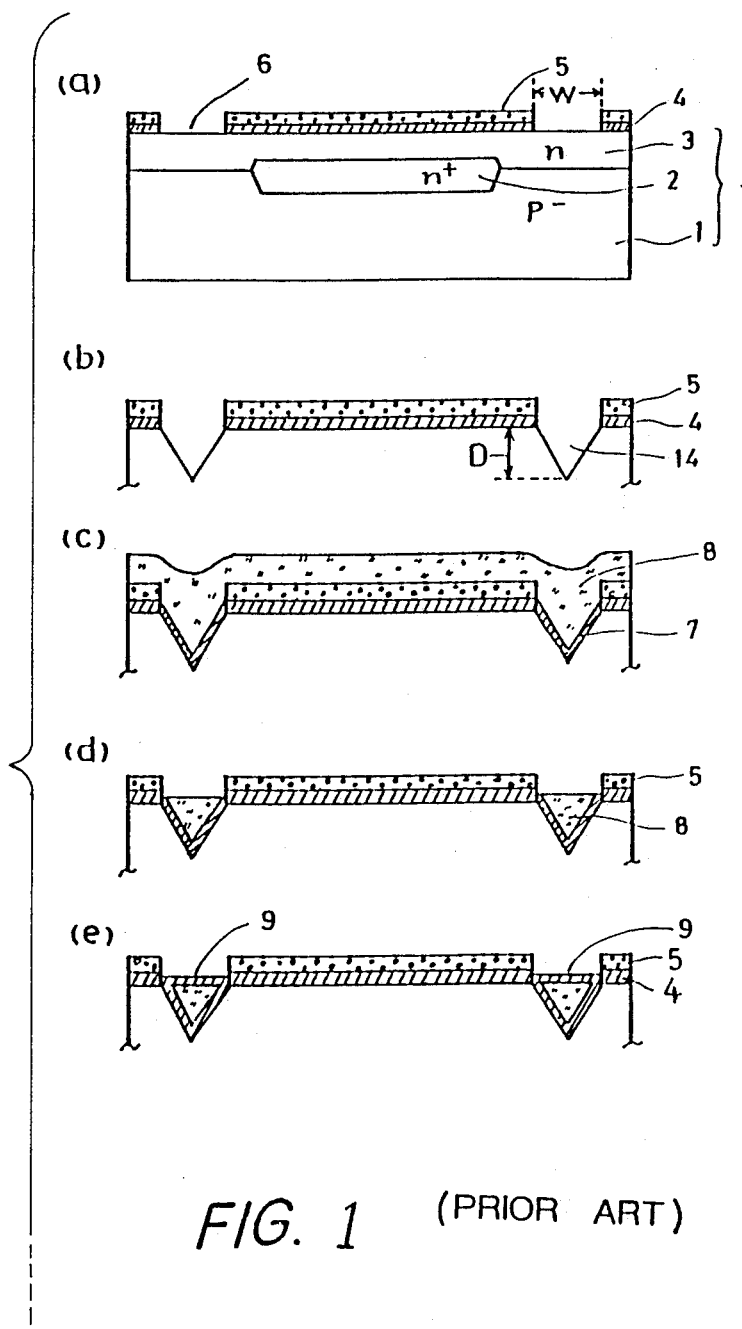
FIGS. 1(a) through 1(f) show a series of cross sectional views corresponding to steps of forming V-groove isolation filled with a dielectric in the prior art.
Figure 1:
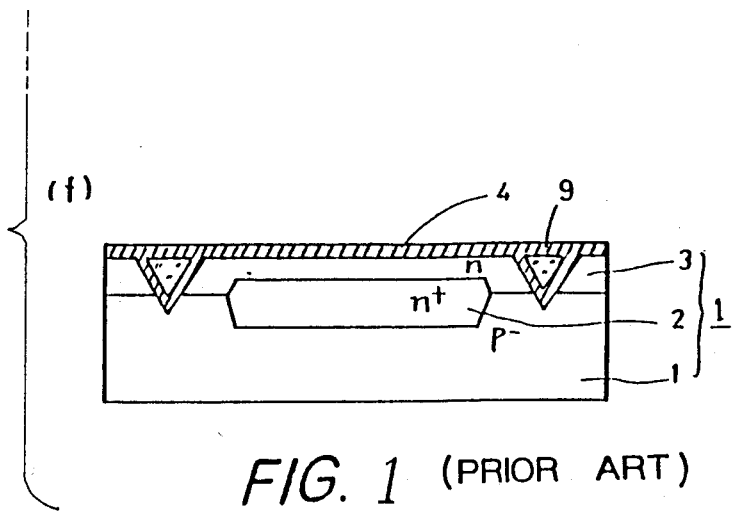
Figure 2:
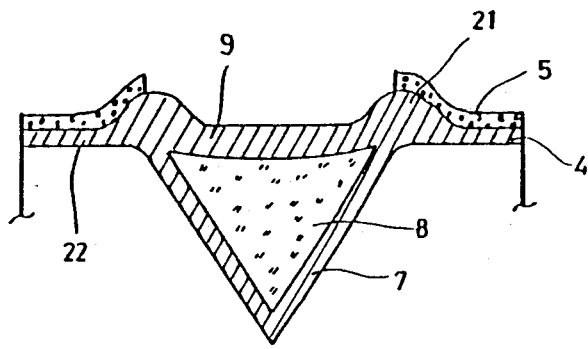
FIG. 2 shows a cross sectional view of the V-groove filled with a dielectric forming BIRD'S HEAD and BIRD'S BEAK of silicon oxide around the groove region in the prior art.
Figure 3:
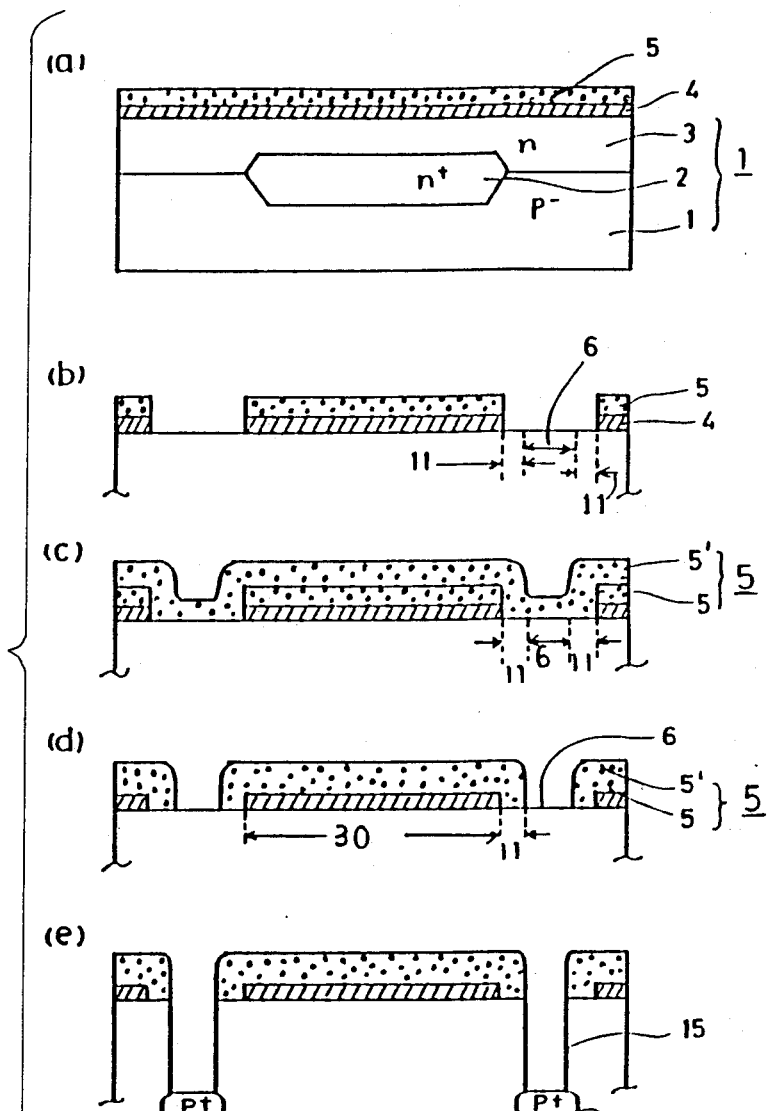
FIGS. 3(a) through 3(h) show a series of cross sectional views corresponding to steps of forming U-groove isolation filled with dielectric of the first embodiment of the present invention.
Figure 3:
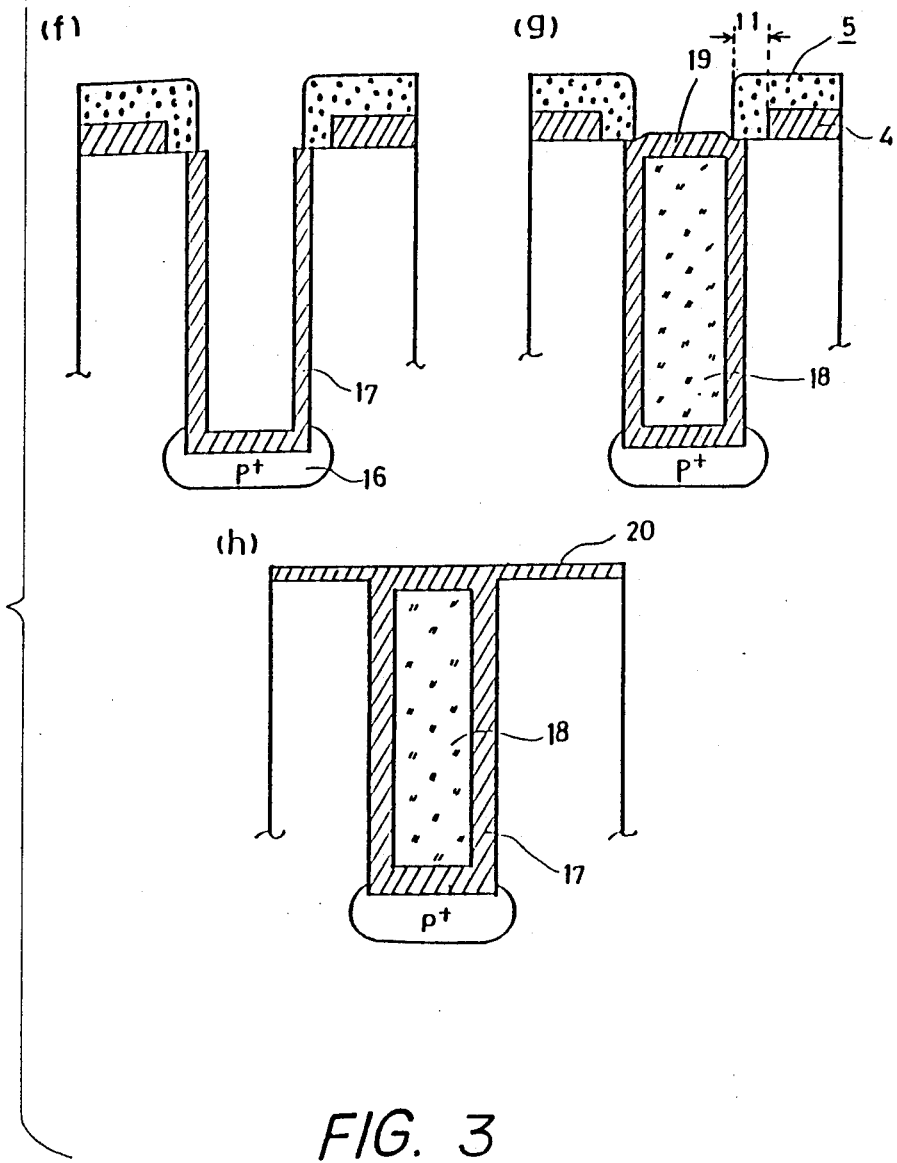

The first embodiment according to the present invention is disclosed using FIGS. 3(a) through 3(b). Each figure shows a cross sectional view of the substrate in the order of manufacturing used in forming groove isolation having a deep trench of U-shape. The following alphabetical step items correspond to a respective figure in FIGS. 3(a) through 3n$h$).

3(a) On a silicon substrate 1 consisting of a silicon base layer 1, a buried layer 2 and an epitaxial layer 3, a silicon oxide layer 4 of 500 to 1,000 Angstrom thickness is formed by thermal oxidation. Then a silicon nitride layer 5 of 1,500 to 2,000 Angstroms is deposited thereon;

3(b) Applying photolithography technology, both silicon oxide layer 4 and silicon nitride layer 5 are selectively removed on a region 6 of the subsequent U-groove forming area and additional specified region 11, having a width of greater than 3,000 Angstroms (3,000 to 5,000 Angstroms is preferable) and surrounding the region 6 of U-groove forming area. This specified region 11 prevents a generation of BIRD'S BEAK and BIRD'S HEAD in the subsequent processes.

3(c) A silicon nitride layer 5' of 3,000 to 5,000 Angstrom thickness is deposited on the entire surface of the substrate. The thickness of silicon nitride layers 5 (5 plus 5') is thickest on the specified region 11 and thinnest on the region of U-groove forming area 6.

3(d) The entire surface of the silicon nitride layer 5 is subjected to a reactive ion etching in a mixed gas of, for example, carbon tetrafluride ($CF_4$) and methane trifluoride ($CHF_3$) until the substrate corresponding to the region 6 is exposed, on which the silicon nitride layer is thinnest. Silicon nitride layers on the specified region 11 as well as on an active region 30 are still remaining at this point. This process is carried out without a mask process. Other methods such as a ion milling may be utilized in this step;

3(e) The substrate is subjected to anisotropic etching of reactive ion etching in carbon tetrachloride ($CCl_4$) and oxygen ($O_2$) atmosphere using silicon nitride layer 5 as a mask, and U-groove 15 is formed. Ion implantation for example, boron, is performed, forming a channel stopper 16.

3(f) Inside surfaces of the U-groove are thermally oxidized, and silicon oxide layers 17 having a thickness of 3,000 to 8,000 Angstroms are formed. An enlarged cross sectional view of one groove is shown is FIG. 3(f).

3(g) Polysilicon 18 is grown on the entire surface of the substrate, filling up the groove. Thereafter the surface of polysilicon is polished mechanically and chemically until the surface of silicon nitride layer 5 is exposed and polysilicon is removed to a level of the surface of the substrate. The surface of polysilicon filling the groove is oxidized forming a silicon oxide layer 19 of 5,000 to 8,000 Angstrom thickness. FIG. 3(g) shows the conditions after the oxidation of polysilicon surface is finished.

3(h) The layers of silicon oxide 4 and silicon nitride 5 on the substrate are removed, and new silicon oxide film 20 having 1,000 Angstrom thickness is formed thereon for an active region for the semiconductor device. Thus U-groove isolation filled dielectric is formed.

In the above first embodiment, the specified region 11 surrounding the groove has a function of separating silicon oxide layer 4 from silicon oxide layers 17 and 19 of the isolation groove as seen in FIG. 3(g), and this region 11 is covered with a protective layer of silicon nitride 5. Therefore the generation of a BIRD'S BEAK or BIRD'S HEAD can be avioded.

In the first embodiment, it is advantageous that only a one mask process is applied in step (b) of exposing regions 6 and 11, and subsequent processes of forming isolation groove are self-aligned with the above mask process.

U-groove is favorable to form a deep isolation groove having a depth of 6 to 8 microns, which penetrates through a silicon epitaxial layer 3 and reaches a silicon base layer 1, which are constituents of substrate 1 shown in FIG. 3(a).

The method employed in the above embodiment is not only limited to the formation of a U-groove, but is applied to form a shallow V-groove when a silicon substrate having crystal orientation of (100) is utilized and wet etching by alkali solution is applied in step (e) to form the V-groove.

The second embodiment according to the present invention is disclosed referring to FIGS. 4(a) through 4(j), which show the forming steps of Y-groove isolation. Each figure shows a cross sectional view of the substrate in an order of the manufacturing steps.

Figure 4:
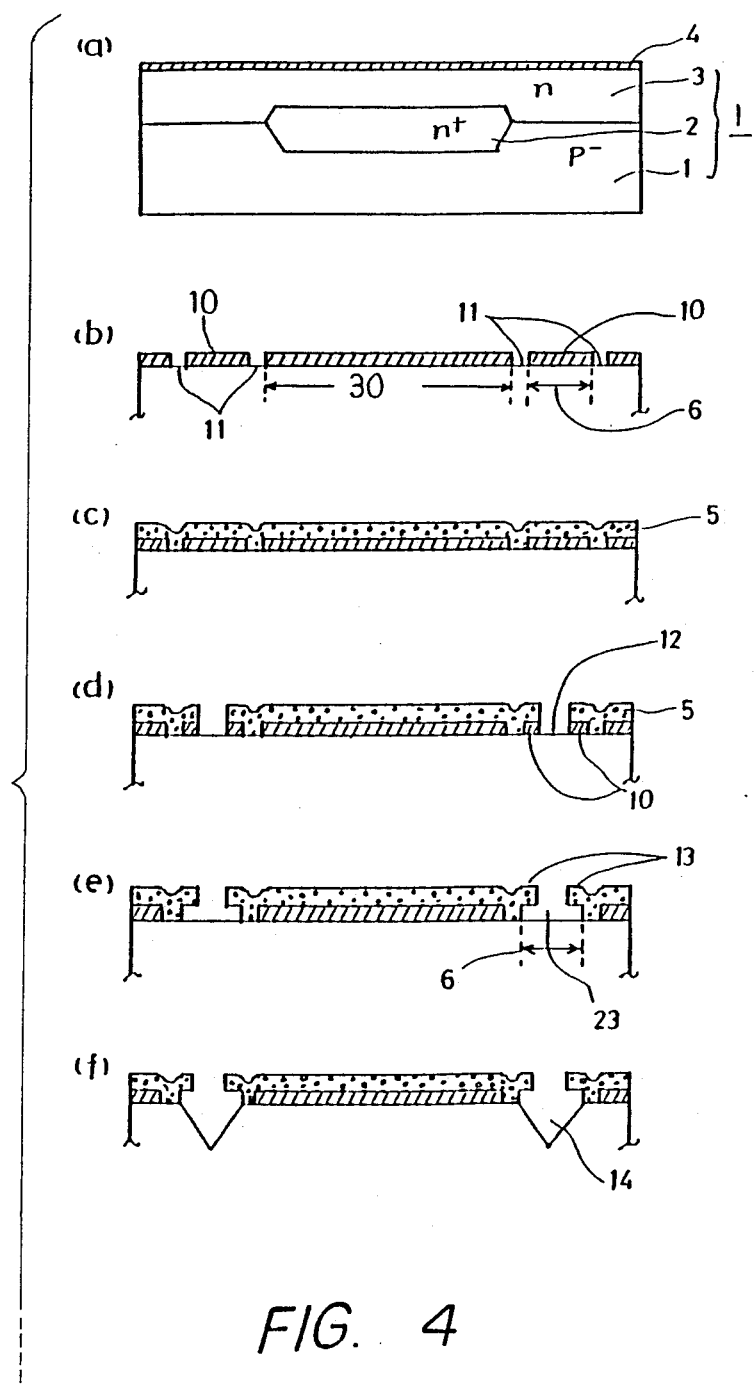
FIGS. 4(a) through 4(j) show a series of cross sectional views corresponding to steps of forming Y-groove isolation filled with a dielectric of the second embodiment of the present invention.
Figure 4:
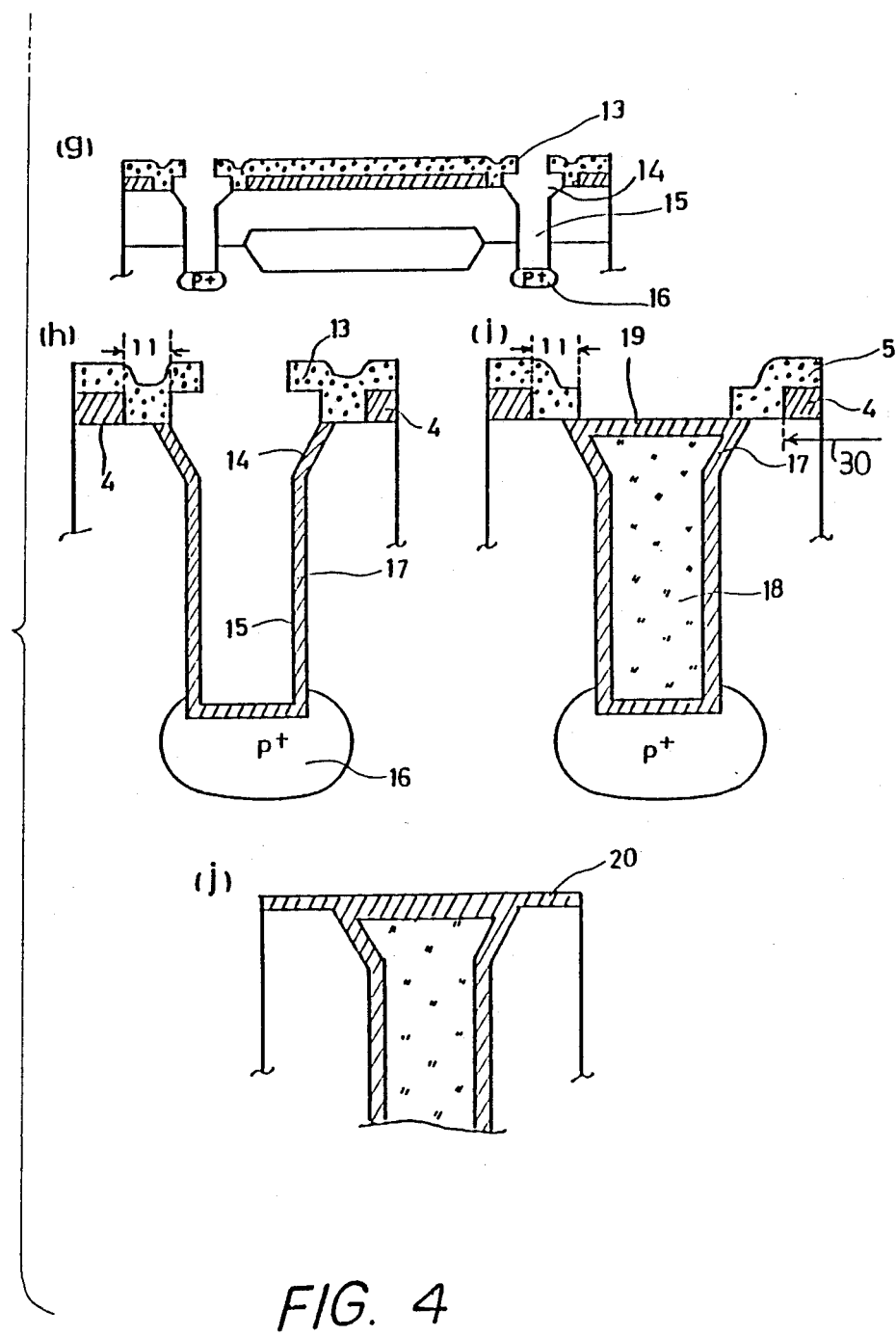

The Y-groove isolation has a structure of a Y-shape in an upper portion, and a parallel-walled trench shape in a lower portion having the same structure as the first embodiment. The following alphabetical step items correspond to each step shown in FIGS. 4(a) through 4(j) respectively;

4(a) A p$^-$-type silicon base layer 1 having crystal orientation (100), an n$^+$-type silicon buried layer 2, and an n-type silicon epitaxial layer 3 form a substrate 1, and a silicon oxide layer (SiO$_2$) 4 having a thickness of 500 to 1,000 Angstroms is formed on the substrate 1 as shown in FIG. 4(a). This step is just the same as that of the bipolar process.

4(b) The silicon oxide layer on a surface area of the specified region 11, which surrounds a subsequent groove forming area 6 for isolation and has a width greater than 3,000 Angstroms (3,000 to 5,000 Angstroms is preferable), is removed by photolithography technology, leaving the silicon oxide layer 10 just above the area of groove isolation and on an active region 30.

4(c) A silicon nitride layer (Si$_3$N$_4$) 5 of 1,500 to 2,000 Angstroms is deposited on the entire surface.

4(d) The silicon nitride layer 5 and silicon oxide layer 10 are partially removed on an area 12, which corresponds to that of a subsequently formed U-groove region.

4(e) Remaining silicon oxide 10 is etched away by a wet etching method using the silicon nitride layer 5 as a mask. The window 23 having overhanging eaves 13 of silicon nitride is formed.

4(f) The exposed substrate region 6 in window 23 is subjected to etching by an alkali solution such as potassium hydroxide (KOH), whereby V-groove 14 is formed anisotropically.

4(g) The substrate is then subjected to anisotropic etching by reactive ion etching in a carbon tetrachloride (CCl$_4$) and oxygen (O$_2$) atmosphere using the overhanging eaves of silicon nitride 13 as a mask, and U-groove 15 is formed under the V-shaped groove 14. Ion implantation of, for example, boron is performed, forming a channel stopper 16.

4(h) Inside surfaces of the grooves 14 and 15 are thermally oxidized, and silicon oxide layers 17 having a thickness of 3,000 to 8,000 Angstroms are formed. An enlarged cross sectional view of one groove is shown in FIG. 4(h).

4(i) The eaves 13 of silicon nitride are removed and polysilicon 18 is grown on the substrate, filling up the groove. Thereafter the surface of polysilicon is polished mechanically and chemically, until the surface of silicon nitride layer 5 is exposed and polysilicon is removed to a level of the surface of the substrate. The surface of polysilicon filling the groove is oxidized forming a silicon oxide layer 19 of 5,000 to 8,000 Angstrom thickness.

4(j) Silicon nitride layer 5 on the substrate and silicon oxide layer 4 on an active region 30 are removed, and then a new silicon oxide film 20 having 1,000 Angstrom thickness is formed thereon. Thus a Y-groove isolation filled with dielectric is formed.

In the above steps 4(h) and 4(i) oxidation of the Y-groove silicon oxide layer 4 is separated from silicon oxide layers 17 and 19 of the isolation groove with the specified region 11 surrounding the groove. The specified region is covered with a protective layer of silicon nitride. Therefore the oxidation processes in steps 4(h) and 4(i) do not bring about a volume growth of silicon oxide forming BIRD'S HEAD or BIRD'S BEAK as in the prior art.

Moreover, in the second embodiment, top portion 14 having a V-shape and constituting an upper portion of a Y-groove is formed self-aligned using the mask process applied in step 4(b), which defines the specified region 11. Therefore, even if the lower U-shape portion of the Y-groove, which is formed using another mask process, has a deviation from an aligned position, the top V-shaped portion of isolation region in the substrate is self-aligned automatically having very small allowance.

Throughout the two embodiments above described, the generation of BIRD'S BEAK or BIRD'S HEAD is prevented and the isolation groove is formed self-aligned. This decreases the width of the isolation region, the location of the isolation region being defined precisely. It also increases the integration density of semiconductor devices.

Although only two embodiments of the invention have been disclosed and described, the present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalence of the claims are, therefore, to be embraced therein.

What I claim is as follows:

1. A method of producing an isolation groove in a semiconductor device having active regions and the isolation groove being formed between two of the active regions, wherein silicon oxide is formed inside the isolation groove, a dielectric material is formed on said silicon oxide, filling up said isolation groove and the isolation groove is leveled with an outer surface of a silicon substrate, said method comprising the steps of:

(a) forming a silicon oxide layer on said substrate;
(b) selectively removing a specified region of said silicon oxide layer so as to expose a part of said substrate, said specified region surrounding a subsequent groove forming area and having a width of a distance preventing a spread of silicon oxidation in a subsequent process;
(c) forming a silicon nitride layer on said silicon oxide layer and the substrate exposed in step (b);
(d) etching selectively both said silicon nitride layer and silicon oxide layer exposing the substrate surface corresponding to said groove forming area, leaving said silicon nitride layer on said specified region and above the active region and forming overhanging eaves above said groove forming area;
(e) subjecting said exposed substrate to a first anisotropic wet etching so as to form a V-groove, and further subjecting said V-groove to a second anisotropic ion etching so as to form a trench in said V-groove resulting in formation of said isolation groove using said silicon nitride layer as a mask;
(f) forming a silicon oxide layer inside said groove;
(g) filling said isolation groove with dielectric material; and
(h) removing said dielectric material until said dielectric material is level with said substrate surface, and oxidizing an exposed surface of said dielectric material using said silicon nitride layer as a mask, forming a silicon oxide layer on said dielectric material;
(i) removing said first and second silicon nitride layers and said silicon oxide layer until the substrate surface in said active region is exposed; and
(j) forming an additional silicon oxide layer on said exposed substrate surface.

2. A method according to claim 1, wherein said substrate having surface crystal orientation (100) is utilized, and said step (e) is carried out by wet etching in alkali solution, whereby a V-shaped groove is formed anisotropically.

3. A method according to claim 1, wherein said substrate having surface crystal orientation (100) is utilized, and said step (e) comprises forming said groove by first wet etching in alkali solution, and second anisotropic etching of reactive sputter etching, whereby Y-shaped isolation groove is formed.

4. A method according to claim 3, wherein said Y-shaped groove penetrates through a silicon epitaxial layer and reaching a silicon base layer therebeneath, both being constituents of said substrate.

5. A method according to claim 1, wherein said specified region has a width of greater than 3,000 Angstroms.

6. A method according to claim 1, wherein said specified region has a width of greater than 3,000 Angstroms.

* * * * *

UNITED STATES PATENT AND TRADEMARK OFFICE
CERTIFICATE OF CORRECTION

PATENT NO. : 4,866,004
DATED : September 12, 1989
INVENTOR(S) : Toshitaka Fukushima It is certified that error appears in the above-identified patent and that said Letters Patent is hereby corrected as shown below:

Col. 5, line 49, "Y" should be --V--. (2nd occurr.)

Col. 7, line 14, delete ",";

Signed and Sealed this

Nineteenth Day of February, 1991

Attest:

HARRY F. MANBECK, JR.

*Attesting Officer*  *Commissioner of Patents and Trademarks*